United States Patent [19]

Hamilton et al.

[11] 4,291,243
[45] Sep. 22, 1981

[54] CHARGE COUPLED DEVICE CHARGE COMPARATOR REFRESHER

[75] Inventors: James M. Hamilton, Hawthorne, Calif.; Craig L. Carrison, Golden Valley, Minn.

[73] Assignee: Hughes Aircraft Company, Culver City, Calif.

[21] Appl. No.: 106,313

[22] Filed: Dec. 21, 1979

[51] Int. Cl.³ ............ H03K 3/353; G11C 19/28; H03K 5/153; H01L 29/78
[52] U.S. Cl. .................. 307/304; 307/221 D; 307/362; 307/DIG. 3; 357/24
[58] Field of Search ............. 307/221 D, 304, 362, 307/DIG. 3; 357/24

[56] References Cited
U.S. PATENT DOCUMENTS

| 4,135,104 | 1/1979 | Allen | 307/221 D |
| 4,150,304 | 4/1979 | Jensen | 307/221 D |

Primary Examiner—Gene M. Munson
Attorney, Agent, or Firm—Robert M. Wallace; William H. MacAllister

[57] ABSTRACT

Charge packet refreshment in a charge transfer device is performed by comparing an input charge packet to be refreshed with a reference level to form a corresponding signal and reference potential barrier and by ejecting charge from beneath a ramp electrode between said signal and reference potential barriers over the lesser of the two barriers. The area of the ramp electrode may be sufficiently large to generate refreshed charge packet of amplified size to spill over one of the two potential barriers in reponse to an input charge packet.

3 Claims, 12 Drawing Figures

Fig. 1a.
(Prior Art)
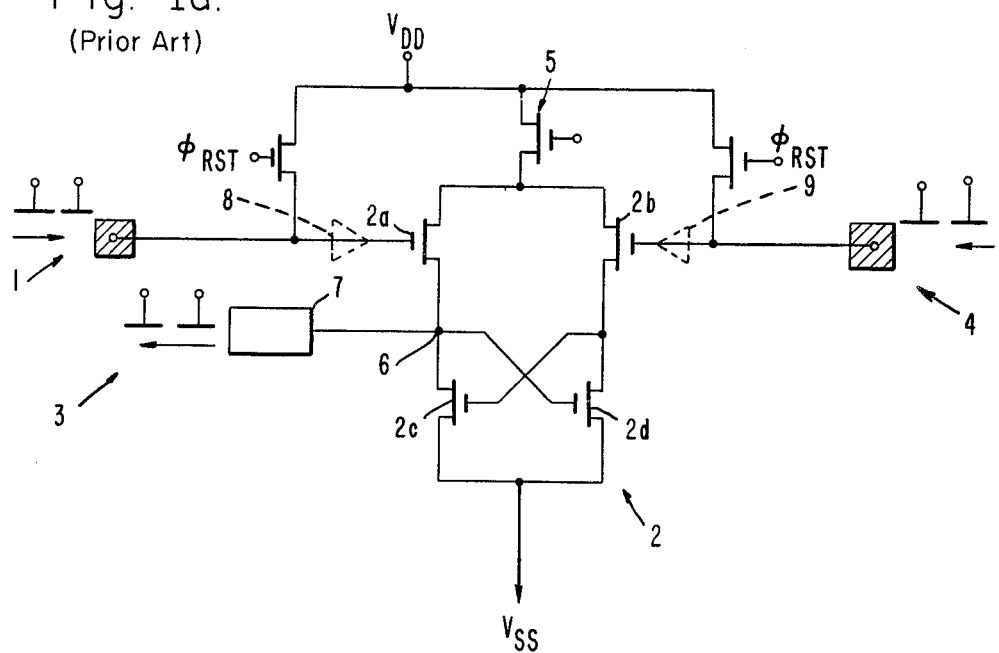
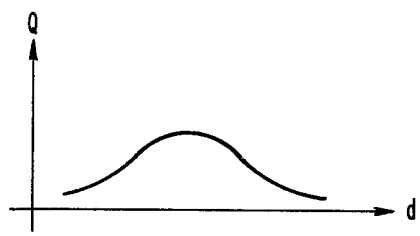
Fig. 1b.
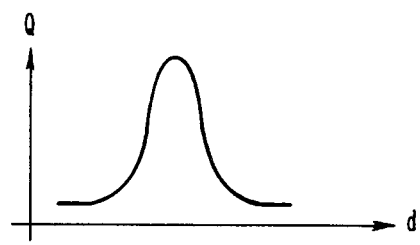
Fig. 1c.

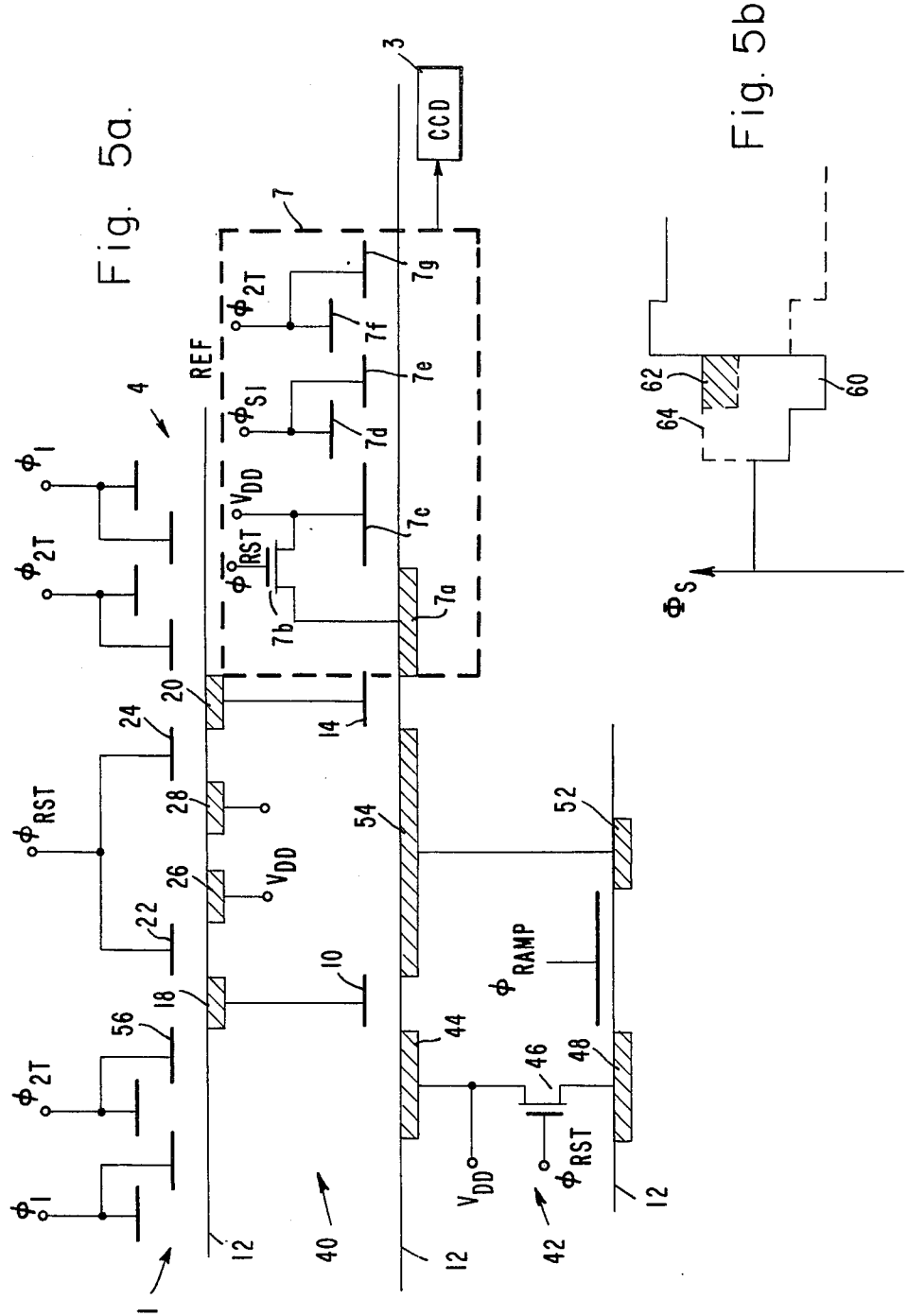

CHARGE COUPLED DEVICE CHARGE COMPARATOR REFRESHER

TECHNICAL FIELD

This invention is useful in charge transfer devices and specifically in charge coupled devices (CCDs) requiring a periodic refreshment of charge packets to compensate for limited charge transfer efficiency, in which charge refreshment must be accomplished at high speed with very low power consumption.

RELATED APPLICATIONS

This application is related to U.S. patent application Ser. No. 106,222, filed Dec. 21, 1979 by James M. Hamilton and John A. Porter entitled "Charge Comparator Output Driver" and assigned to the assignee of the present application.

BACKGROUND ART

One fundamental problem of charge transfer devices and specifically of charge coupled devices is that the charge transfer efficiency of these devices is limited. As a result, charge packets originally introduced into these devices dissipate in amplitude and diffuse in definition during transfer in the device, which may cause information represented by each charge packet to be lost before it can be retrieved. One prior art solution to limited charge transfer efficiency in charge coupled devices used in digital signal processing is to provide a binary charge refresher which accomplishes charge refreshment by comparing the dissipated signal charge packet with a reference. A resettable bistable multivibrator performs the comparison by latching into one of its two states depending upon whether the signal or reference is greater. The reference is selected to define a charge level which is above the charge coupled device fat zero. In one state, the multivibrator output fills a complete bucket in a charge coupled device output register to provide a logic "1" and in its other state leaves an empty bucket in the output register to provide a logic "0."

One problem with this type of prior art charge refreshment is that the feedback nodes of the multivibrator are typically connected to a large output capacitance, which limits the output voltage of the refresher, a problem which may be overcome by amplification of the signal and reference inputs to the multivibrator. However, it has been found that amplification of the inputs to the multivibrator by source followers can lead to a large offset voltage in the comparison function of the device, which, for many applications, is unacceptable.

Another problem of the prior art is that, in current efforts to develop charge coupled device (CCD) logic circuits, implementation of decoders and encoders requires that the output from a single device must fan out in a logic tree, a configuration well known to those skilled in the art. While logic fan-out has not presented a severe problem to logic designers using bipolar or MOSFET technology, logic fan-out in CCD logic circuits requires that an output charge packet be distributed over a large number of devices, which may lead to the dissipation of a single charge packet below the minimum signal level. The prior art solution to this problem has been to provide charge amplification using active devices which increase the power consumption of the CCD logic circuit, a significant disadvantage.

SUMMARY OF THE INVENTION

The foregoing problems are overcome in the present invention, a charge coupled device which provides a charge refreshment function which is free of the disadvantages of the prior art charge refreshers discussed above and provides a charge amplification function useful in CCD logic circuits to solve the CCD logic fan-out problem without significantly increasing power consumption. The invention includes a ramp control gate providing a source of charge flow to two channels. Charge flow from beneath the ramp gate to the two channels is controlled by a signal gate and a reference gate, respectively. The voltage on the signal gate is controlled by charge packets which are to be refreshed and which are held in an input CCD, and the voltage on the reference gate is controlled by a selected reference level voltage.

If the voltage on the signal gate (determined by the signal charge packet to be refreshed) is in excess of the reference voltage applied to the reference gate, the charge stored in a potential well in the substrate beneath the ramp gate flows under the reference gate into the first of the two channels when the voltage on the ramp gate is clocked up. On the other hand, if the voltage on the signal gate is less than the reference voltage applied to the reference gate, the charge held beneath the ramp gate flows instead under the signal gate into the second charge flow channel when the voltage on the ramp gate is clocked up. The clock signal applied to the ramp gate has a saw tooth or ramp shape on the leading edge of its time domain waveform to provide stability. The charge stored under the ramp gate is of improved size and definition with respect to the original signal charge packet so that the new charge packet transferred from under the ramp gate represents a refreshed charge packet, and flows into the first channel controlled by the reference gate only if the original charge packet exceeds a threshold charge level determined by the voltage applied to the reference gate.

The use of a saw tooth or ramp clock signal applied to the ramp gate permits a stable charge flow to only one of the two channels even when a very small difference between the potentials on the signal gate and the reference gate exists. Charge amplification is controlled by the charge storing capacity of the ramp gate, and, by the simple expedient of increasing the area of the ramp gate, the amount of charge spilled beneath the reference gate in response to an original charge packet may be increased significantly to provide a charge amplification function useful in CCD logic circuits to solve the CCD logic fanout problem discussed previously.

DESCRIPTION OF THE FIGURES

The invention is best understood by reference to the accompanying drawings, in which:

FIG. 1a is a schematic diagram of a refresher circuit of the prior art;

FIG. 1b illustrates the spatial distribution of a charge packet prior to refreshment;

FIG. 1c illustrates the spatial distribution of a refreshed charge packet;

FIG. 6d illustrates the time domain waveform of the clock signal $\phi_{2t}$;

FIG. 5a is a schematic diagram of the preferred embodiment of the charge coupled device charge comparator and charge amplifier of the present invention; and FIG. 5b is a diagram of the substrate electrical surface potential corresponding to the output CCD register of FIG. 5a.

DETAILED DESCRIPTION OF THE INVENTION

Figure 2:
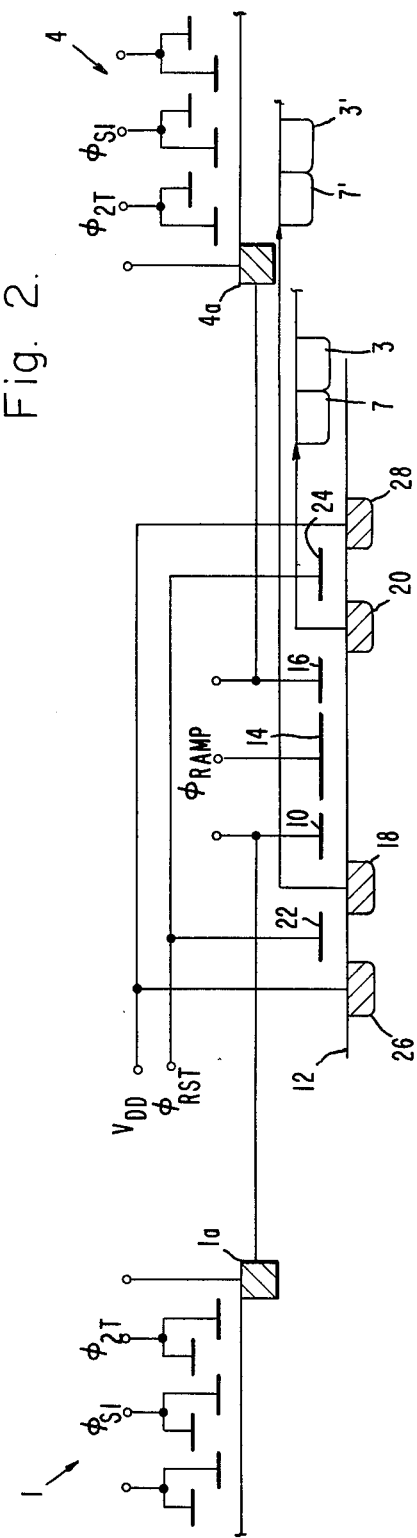
FIG. 2 is a schematic diagram of the charge coupled refresher circuit and charge amplifier of the present invention.

Referring to the prior art charge refreshing circuit of FIG. 1a, refreshing of original signal charge packets of diminished magnitude and diffused definition corresponding to the spatial charge distribution illustrated in FIG. 1b in an input charge coupled device flow channel 1 is performed by a bistable multivibrator circuit 2 comprising four field effect transistors, 2a–d, controlling production of refreshed charge packets corresponding to the improved spatial charge distribution illustrated in FIG. 1c, which are injected into an output charge coupled device flow channel 3. Signal charge packets in the input CCD register 1 control the voltage on the gate of the transistor 2a while charge supplied by a reference charge coupled device flow channel 4 controls the voltage on the gate of the transistor 2b. Feedback in the latch or multivibrator 2 is provided by connecting the source and drain of the transistors of 2c and 2d serially with the source and drain of the transistors 2a and 2b, respectively, and connecting the source of the transistor 2a to the gate of the transistor 2d and the source of the transistor 2b to the gate of the transistor 2c. The drains of the transistors 2a and 2b are connected together through a control field effect transistor 5 to a drain voltage supply $V_{dd}$, while the sources of the transistors 2c and 2d are connected together to a source voltage supply $V_{ss}$.

When the transistor 5 is turned on, current will flow between the voltage supplies $V_{dd}$ and $V_{ss}$ through either a first leg comprising the transistors 2a and 2c or through a second leg comprising the transistors 2b and 2d, depending upon whether or not the voltage produced on the gate of the transistor 2a by the signal charge packet in the channel 1 is less than or greater than the reference voltage on the gate of the transistor 2b, respectively. If more current initially flows through the first leg, feedback from the source voltage of the transistor 2a to the gate of the transistor 2d turns the transistor 2d off to prevent current flow through the second leg, while if more current initially flows instead through the second leg, the source voltage of the transistor 2b applied to the gate of the transistor 2c turns the transistor 2c off to prevent current flow through the first leg.

The voltage on output node 6 is applied to a charge injection means 7 of any type well-known in the art which allows charge to enter the output CCD register 3. Thus, a sharply defined logic signal at the node 6 is used to generate a sharply defined refreshed charge packet having the spatial distribution illustrated in FIG. 1c. A disadvantage of this prior art circuit is that the current on the output node 6 is divided between the current applied to the charge injection means 7 and the current applied as feedback from the source of the transistor 2a to the gate of the transistor 2d. Typically, in this type of circuit the node 6 has a large output capacitance which limits the output voltage applied to the charge injection means 7. In one variation of the prior art circuit of FIG. 1, the output voltage was increased by providing source follower amplifiers 8 and 9 to amplify the voltage applied to the gate of the transistors 2a and 2b, respectively. However, it was observed that upon introduction of the source followers 8 and 9, operation of the circuit of FIG. 2 was centered about a large offset voltage with respect to the voltage difference between the gates of the transistors 2a and 2b, a significant disadvantage.

The foregoing difficulties are overcome in a charge coupled device charge refresher and charge amplifier of the present invention illustrated in FIG. 2 which requires no feedback or latching, in which the potential on the signal gate 10 overlying a semiconductive substrate 12 of n-type conductivity is controlled by a floating diffusion 1a of the p-type conductivity in the input CCD register 1, the diffusion 1a sensing a signal charge packet of positive carriers or holes which is to be refreshed or amplified. A ramp gate 14 adjacent the signal gate 10 creates a potential well in the surface of the substrate 12 to store charge directly beneath the gate 14. The ramp gate 14 is also adjacent a reference gate 16 which has its potential set by charge sensed in a reference CCD register 4 to define a reference charge level. Alternatively, the potential of the reference gate 16 may be set by connection to a selected DC voltage source having a voltage corresponding to a charge level in excess of the fat zero charge in the device. The signal gate 10 and the reference gate 16 control the flow of charge from beneath the ramp gate 14 into adjacent diffusions 18 and 20, respectively, which are of opposite conductivity type with respect to the substrate 12.

Briefly, after an unrefreshed signal charge packet is sensed in the CCD register 1 to produce a potential on the signal gate 10, the potential on the ramp gate 14 is increased linearly in time to cause the charge stored beneath the ramp gate 14 to be expelled at a constant rate. The expelled charge will flow under either the signal gate 10 to the diffusion 18 or under the reference gate 16 to the diffusion 20 depending upon whether the voltage applied to the signal gate 10 is less than or greater than the reference voltage applied to the reference gate 16, respectively. If only a small amount of charge is sensed in the CCD input register 1 (so that the potential on the signal gate 10 is less than the reference voltage on the reference gate 16), the charge expelled from beneath the ramp gate 14 flows into the diffusion 18. On the other hand, if a sufficiently large amount of charge is sensed in the CCD input register 1 (so that the voltage on the signal gate 10 is greater than the reference voltage on the gate 16), the charge expelled from beneath the ramp gate 14 flows into the diffusion 20.

FIG. 2 shows that the charge received by the diffusion 20 is transferred to the charge injection means 7 and introduced into the CCD output register 3. The size of the output charge packet may be amplified by increasing the area of the ramp gate 14 to supply a correspondingly increased amount of charge to the CCD output register 3. As discussed previously, this feature of the invention may be used as a charge amplifier in a CCD logic circuit at the input to a logic tree having a large amount of logic fan-out.

Figure 3:
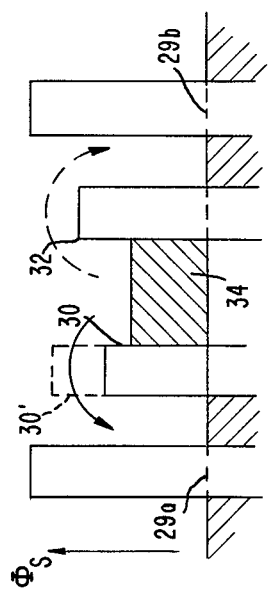
FIG. 3 is a diagram of the surface potential corresponding to the circuit of FIG. 2.
Figure 4:
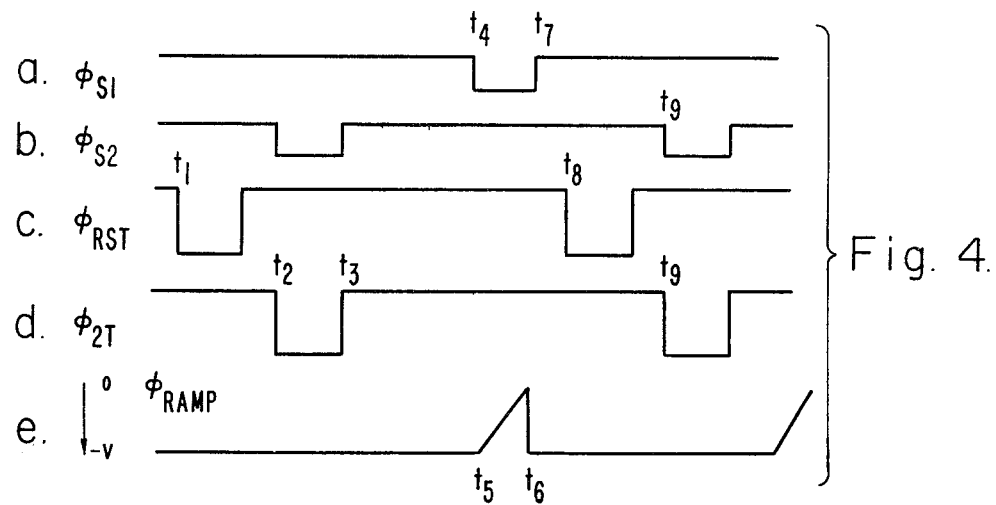
FIG. 4a illustrates the time domain waveform of the clock signal $\phi_{S1}$.
FIG. 4b illustrates the time domain waveform of the clock signal $\phi_{S2}$.
FIG. 4c illustrates the time domain waveform of the clock signal $\phi_{rst}$.
FIG. 4e illustrates the time domain waveform of the clock signal $\phi_{ramp}$ applied to the ramp gate of FIG. 3.

Operation of the charge refresher of FIG. 2 will now be described by simultaneous reference to FIGS. 3 and 4. At time $t_1$ of FIG. 4 the clock signal $\phi_{rst}$ is pulsed negatively, causing the surface potentials directly underlying reset gates 22 and 24 in the substrate 12 to assume the dashed line positions 29a, 29b illustrated in FIG. 3, thus permitting charge conduction between the diffusions 18 and 20 and reset diffusions 26 and 28, so that the output diffusions 18 and 20 are both set to the drain voltage $V_{dd}$. Thereafter, between times $t_2$ and $t_3$ of FIG. 4 the clock signal $\phi_{2t}$ is applied as a negative going pulse to both the input CCD register 1 and the reference CCD register 4 to cause charge packets in the input register 1 and the reference register 4 to be sensed by charge sensing means 1a and 4a in the input register 1 and the reference source 4, respectively, so that a signal voltage is applied to the signal gate 10 and a reference voltage is applied to the reference gate 16. As a result, surface potential barriers 30 and 32 illustrated in FIG. 3 are created in the substrate 12 directly underlying the signal and reference gates 10 and 16 respectively. FIG. 3 illustrates the exemplary configuration of the substrate surface potential at time $t_3$ when the signal voltage on the gate 10 is less than the reference voltage on the gate 16.

At time $t_4$ the ramp clock signal $\phi_{ramp}$ of FIG. 4e applied to the ramp gate 14 begins to increase linearly in magnitude, thus causing the depth of the potential well defined between the potential barriers 30 and 32 to decrease. Charge previously stored in the potential well 34 spills over the lowest of the two potential barriers 30, 32 at a uniform rate proportional to the slope of the leading edge of the clock signal $\phi_{ramp}$. Because the charge stored in the potential well 34 flows at a controlled constant rate, this charge will be expelled over only the lowest of the two potential barriers 30, 32, and, in the situation illustrated in FIG. 3, will flow over the potential barrier 30 created beneath the signal gate 10 to be received in the diffusion 18.

It should be noted that if the charge stored beneath the ramp gate 14 were rapidly expelled by use of a square pulse for the clock signal $\phi_{ramp}$ instead of the sawtooth wave illustrated in FIG. 4e, the likelihood of the expelled charge flowing over both of the potential barriers 30 and 32 to be sensed in both the diffusions 18 and 20 would be increased, which would prevent the circuit of FIG. 2 from distinguishing between a "1" charge packet in the input register 1 and a "0" charge packet in the input register 1.

If the charge packet sensed in the input register 1 is sufficiently large (i.e., a logic "1"), the voltage applied to the signal gate 10 may be greater than the voltage on the reference gate 16, creating a relatively high potential barrier 30' illustrated in dashed line in FIG. 3 so that the charge expelled from the potential well 34 beneath the ramp gate 14 will flow over the potential barrier 32 beneath the reference gate 16 to be sensed by the diffusion 20, thus generating a logic "1." The voltage induced in floating diffusion 20 controls a charge input device 7 in the output charge coupled device register 3 to inject a sharply defined refreshed charge packet of the type illustrated in FIG. 1c into the CCD register 3 whenever the charge packet sensed in the input register 1 exceeds a reference level furnished by the reference CCD register 4.

The preferred embodiment of the charge refresher of the present invention is illustrated in the schematic diagram of FIG. 5a and includes first and second charge flow channels 40 and 42, the first charge flow channel 40 including the input CCD register 1, the reference CCD register 4, the reset gates 22, 24, the reset diffusions 26, 28 and the floating diffusions 18 and 20. The second channel 42 includes the signal and reference gates 10 and 14, an input diffusion 44 set to a voltage $V_{dd}$, a reset transistor 46, a floating diffusion 48, an intermediate diffusion 52, a ramp gate 50 overlying the substrate 12 between the diffusions 48 and 52 and an output diffusion 54 connected to the intermediate diffusion 52 and disposed in the substrate 12 between the signal and reference gates 10 and 14. The reference gate 14 is disposed between the output diffusion 54 and the charge injection device 7 controlling charge flowing from the output diffusion 54 beneath the reference gate 14 into the charge coupled device register 3. The charge injector 7 comprises an input diffusion 7a and a plurality of electrodes 7c–g overlying the substrate 12 to form the electrical substrate surface potential illustrated in FIG. 5b.

Operation of the preferred embodiment comparator of FIG. 5a will now be described by reference to the clock diagrams of FIG. 4 and the surface potential diagram of FIG. 5b. At time $t_1$ of FIG. 4, the clock signal $\phi_{rst}$ illustrated in FIG. 4c is pulsed negatively, causing the surface potential beneath the reset gates 22 and 24 in the charge flow channel 40 to decrease, permitting current to flow from the reset diffusions 26 and 28 to the signal diffusion 18 and the reference diffusion 20, respectively, so that the signal and reference diffusions 18 and 20 are set to the potential $V_{dd}$ applied to the reset diffusions 26 and 28. Simultaneously, the clock signal $\phi_{rst}$ is applied to the gate of the reset transistor 46 in the second charge flow channel 42 to reset the drain diffusion 48 to the voltage $V_{dd}$. Referring to FIG. 4e, at time $t_1$ the clock signal $\phi_{ramp}$ applied to the ramp gate 50 is a negative voltage with respect to the substrate 12, so that the substrate surface between the diffusions 48 and 52 is inverted, creating a potential well directly beneath the ramp gate 50 and allowing charge to flow between the diffusions 48 and 52. Therefore, at time $t_1$ when the clock signal $\phi_{rst}$ turns the transistor 46 on, the voltage $V_{dd}$ is also applied to the diffusions 52 and 54 through the charge flowing under the ramp gate 50. As a result, all of the diffusions 44, 48, 52, and 54 in the second charge flow channel 42 are set to the voltage $V_{dd}$ at time $t_1$. Thus, the potential well beneath the ramp gate 50 is filled with charge so that charge equilibration is achieved between the input diffusion 44, the diffusion 48, the inverted region beneath the ramp gate 50, the intermediate diffusion 52 and the ramp diffusion 54.

Subsequently, at time $t_2$ the clock signal $\phi_{2t}$ illustrated in FIG. 4d, which is an amplified version of the clock signal $\phi_{s2}$ illustrated in FIG. 4b, is pulsed negatively, so that the signal charge (transferred from left to right in the CCD signal register 1) is held beneath electrode 54 adjacent the signal input diffusion 18 while a reference charge packet (transferred from right to left in the CCD reference register 4) is held beneath electrode 58 adjacent the reference input diffusion 20. As soon as the clock signal $\phi_{2t}$ is turned off at time $t_3$, the signal charge packet previously held under the electrode 56 flows into the diffusion 18 while the reference charge packet previously held beneath the electrode 58 flows into the input diffusion 20, immediately creating a voltage on the signal gate 10 proportional to the signal charge packet and creating a voltage on the reference gate 14 proportional to the reference charge packet.

At time $t_5$, the clock signal $\phi_{ramp}$ begins to ramp upwardly as illustrated in FIG. 4e beginning at the negative voltage ($-V$) and progressing toward zero volts so that charge stored in the potential well in the substrate directly beneath the ramp gate 50 is expelled at a uniform rate. The expulsion of charge from beneath the ramp gate 50 forces charge to flow from the intermediate diffusion 52 to the ramp diffusion 54 at a uniform rate determined by the slope of the sawtooth waveform of the clock signal $\phi_{ramp}$ illustrated in FIG. 4e. The charge entering the ramp diffusion 54 will flow under either the signal gate 14 or the reference gate 10. If, for example, the signal charge packet stored in the signal diffusion 18 is small in comparison with the reference charge packet stored in the diffusion 20, the charge from the ramp diffusion 54 will spill beneath the reference gate 10 into the diffusion 44. On the other hand, if the signal charge packet stored in the signal diffusion 18 is greater than the size of the reference charge packet stored in the diffusion 20, the charge expelled into the ramp diffusion 54 will spill instead under the signal gate 14 and enter the charge input device 7, to be injected into the CCD output register 3.

The charge injection device 7 may be of any type well known in the art, although in the embodiment illustrated in FIG. 5a it includes a floating input diffusion 7a periodically reset to the voltage $V_{dd}$ through a MOSFET 7b having its gate controlled by the clock signal $\phi_{rst}$. An input gate 7c adjacent the input diffusion 7a is set to the voltage $V_{dd}$. Clocked input gates 7d and 7e are controlled by the clock signal $\phi_{s1}$ illustrated in FIG. 4a, while clocked input electrodes 7f and 7g located between the electrode pair 7d, 7e and the CCD output register 3 are controlled by the clock signal $\phi_{2t}$.

Operation of the input device 7 is as follows: At time $t_4$ the clock signal $\phi_{s1}$ is negative. Subsequently, as the clock signal $\phi_{ramp}$ rises from time $t_5$ to time $t_6$, charge flows from the ramp diffusion 54 beneath the reference gate 14 into the resettable floating diffusion 7a (assuming that the voltage applied to the signal gate 10 is greater than the voltage applied to the reference gate 14) and under the electrode 7c into a potential well 60 in the substrate directly beneath the electrode 7e. At time $t_7$, the clock signal $\phi_{s1}$ is turned off, causing the surface potential beneath the clocked gates 7d, 7e to return to the dashed line position illustrated in FIG. 5b. A charge metering function is provided at time $t_8$ when the clock signal $\phi_{rst}$ causes the input diffusion 7a to be reset to the voltage $V_{dd}$, which causes all charge located to the left of the potential barrier 64 to spill back into the diffusion 7a. Subsequently, the remaining charge held in dashed-line well 62 is clocked beneath the gates 7f, 7g at time $t_9$ when the clock signal $\phi_{2t}$ is pulsed negatively. Thereafter, the charge packet previously held in the potential well 62 is clocked serially from left to right in the CCD output register 3.

Although the preferred embodiment illustrated in FIG. 5a is disclosed as a p-channel device built on an n-type substrate, the device is equally useful as an n channel device built on a p-type substrate, in which the conductivity of all the diffusions is n-type and the polarity of the various voltages and clock signals applied to the circuit of FIG. 5a is suitable reversed. The charge amplification function provided by this invention may be enhanced by increasing the area of the ramp gate 50 to increase the amount of charge entering into the ramp diffusion 54 while the charge handling capacity of the charge injection device 7 may be increased accordingly by increasing the area of the various gates 7a, c, d, e, f, g. Thus, charge refreshment and charge amplification is provided without requiring any amplifier or latching circuits which would otherwise consume large quantities of power. Therefore the device is an ideal solution to the problem of logic fan-out in low power CCD logic circuits, in addition to being a low power charge refresher useful in all charge coupled device circuits.

What is claimed is:

1. A charge transfer device comparator refresher formed on the surface of a semiconductive substrate having a substrate electrical potential, comprising:
    an input source of charge packets to be refreshed;
    an output charge flow channel;
    a first voltage source;
    means for forming a first potential well in said substrate surface potential to store charge in said potential well, said potential well having a charge storing potential depth proportional to the voltage of said first voltage source;
    means for forming a signal potential barrier in said substrate surface potential, said signal barrier having a height proportional to the size of charge packets to be refreshed from said input source;
    means for forming a reference potential barrier of a selected reference height in said substrate surface potential;
    means for changing the voltage of said first voltage source to eject charge stored by said potential well forming means and overflow one of said signal and reference potential barriers whenever one of said signal and reference potential barrier heights is less than the other, respectively;
    means for injecting charge into said output charge flow channel in response to charge overflowing one of said reference and signal barriers wherein said means for forming a first potential well comprise a ramp electrode overlying said substrate and connected to said voltage source;
    and wherein said device further comprises:
    an input diffusion in said substrate surface;
    a drain voltage source connected to said input diffusion;
    a floating diffusion in said substrate surface adjacent said ramp electrode;
    a reset transistor connected between said floating diffusion and said drain voltage source;
    an intermediate diffusion in said substrate surface adjacent said ramp electrode; and
    an output diffusion in a portion of said substrate between said signal snd reference potential barriers.

2. The device of claim 1 wherein:
    said input source of charge packets to be refreshed comprises a charge transfer device serial register including a floating electrode;
    said signal barrier forming means comprise a signal electrode connected to said floating electrode adjacent said output diffusion; and
    said reference barrier forming means comprise a reference electrode having an applied selected reference potential adjacent said output diffusion.

3. The device of claim 1 wherein:
    said output charge flow channel comprises a charge transfer device serial register; and
    said charge injecting means comprise an input diffusion and a plurality of clocked transfer electrodes in said output charge transfer device serial register.

* * * * *